(12) United States Patent
Chism et al.

(10) Patent No.: US 9,347,616 B2
(45) Date of Patent: May 24, 2016

(54) REFILLABLE AMPOULE WITH PURGE CAPABILITY

(75) Inventors: Richard D. Chism, Round Rock, TX (US); Andy Krell, Spicewood, TX (US)

(73) Assignee: ENTEGRIS, INC., Billerica, MA (US)

( * ) Notice: Subject to any disclaimer, the term of this patent is extended or adjusted under 35 U.S.C. 154(b) by 19 days.

(21) Appl. No.: 14/119,402

(22) PCT Filed: May 24, 2012

(86) PCT No.: PCT/US2012/039386
§ 371 (c)(1),
(2), (4) Date: Nov. 21, 2013

(87) PCT Pub. No.: WO2012/166528
PCT Pub. Date: Dec. 6, 2012

(65) Prior Publication Data
US 2014/0083512 A1   Mar. 27, 2014

Related U.S. Application Data

(60) Provisional application No. 61/491,178, filed on May 28, 2011.

(51) Int. Cl.
*F16K 27/00* (2006.01)
*F17D 1/04* (2006.01)
*H01L 21/67* (2006.01)
*C23C 16/44* (2006.01)
*C23C 16/448* (2006.01)
(Continued)

(52) U.S. Cl.
CPC .............. *F17D 1/04* (2013.01); *C23C 16/4408* (2013.01); *C23C 16/4482* (2013.01); *C23C 16/45561* (2013.01); *F17C 13/04* (2013.01); *H01L 21/67017* (2013.01); *Y10T 137/0318* (2015.04); *Y10T 137/877* (2015.04)

(58) Field of Classification Search
USPC ........................................ 137/884, 269, 271
See application file for complete search history.

(56) References Cited

U.S. PATENT DOCUMENTS 4,676,404 A    6/1987   Yamazaki et al.
4,859,375 A *   8/1989   Lipisko et al. ................. 261/20
(Continued)

FOREIGN PATENT DOCUMENTS

JP    60-84136 A    5/1985
JP    60-84137 A    5/1985
(Continued)

*Primary Examiner* — John Fox
(74) *Attorney, Agent, or Firm* — Hultquist PLLC; Steven J. Hultquist; Maggie Chappois

(57) ABSTRACT

A fluid delivery system adapted to isolate an ampoule and/or process line during purge, including an inlet control valve connecting a source of pressurized gas to a refillable ampoule, an outlet control valve connecting the refillable ampoule to a location of use, a process control valve connecting a process line to the refillable ampoule, a process isolation valve, and a purge supply valve, e.g., a three-way purge supply valve, arranged between the process isolation valve and the process control valve. A method of purging a fluid delivery system is also disclosed, including closing a process isolation valve, connecting a process line to a refillable ampoule, supplying a purge gas through a purge supply valve, e.g., a three-way purge supply valve, and cycling open and close at least once a process control valve coupled to the process line. A manifold for use in refilling an ampoule and purging a fluid supply system is also described.

11 Claims, 1 Drawing Sheet

(51) Int. Cl.
*C23C 16/455* (2006.01)
*F17C 13/04* (2006.01)

(56) References Cited

U.S. PATENT DOCUMENTS

| | | | |
|---|---|---|---|
| 5,293,893 A | | 3/1994 | O'Dougherty |
| 5,465,766 A | | 11/1995 | Siegele et al. |
| 5,551,309 A | | 9/1996 | Goossens et al. |
| 5,562,132 A | | 10/1996 | Siegele et al. |
| 5,590,695 A | | 1/1997 | Siegele et al. |
| 5,607,002 A | | 3/1997 | Siegele et al. |
| 5,690,743 A | | 11/1997 | Murakami et al. |
| 5,711,354 A | | 1/1998 | Siegele et al. |
| 5,730,804 A | | 3/1998 | Gomi et al. |
| 5,749,389 A | * | 5/1998 | Ritrosi et al. ............ 137/15.04 |
| 5,878,793 A | | 3/1999 | Siegele et al. |
| 5,950,693 A | | 9/1999 | Noah et al. |
| 5,964,254 A | * | 10/1999 | Jackson ...................... 141/21 |
| 6,019,849 A | | 2/2000 | Yao et al. |
| 6,029,717 A | | 2/2000 | Siegele et al. |
| 6,029,718 A | | 2/2000 | Jackson et al. |
| 6,056,024 A | * | 5/2000 | Noah et al. ................. 141/21 |
| 6,192,919 B1 | | 2/2001 | Jackson et al. |
| 6,199,599 B1 | | 3/2001 | Gregg et al. |
| 6,260,588 B1 | | 7/2001 | Noah et al. |
| 6,296,025 B1 | | 10/2001 | Gregg et al. |
| 6,296,026 B1 | | 10/2001 | Gregg et al. |
| 6,431,229 B1 | | 8/2002 | Birtcher et al. |
| 6,435,229 B1 | | 8/2002 | Noah et al. |
| 6,457,494 B1 | | 10/2002 | Gregg et al. |
| 6,557,593 B2 | | 5/2003 | Siegele et al. |
| 6,629,627 B1 | * | 10/2003 | Siegele et al. ............ 222/464.1 |
| 7,011,299 B2 | * | 3/2006 | Curran ........................ 261/66 |
| 7,025,337 B2 | * | 4/2006 | Curran ........................ 261/62 |
| 7,334,595 B2 | * | 2/2008 | Birtcher et al. ........... 137/15.04 |
| 2005/0066893 A1 | | 3/2005 | Soininen |
| 2005/0183771 A1 | | 8/2005 | Scholz |
| 2006/0121192 A1 | | 6/2006 | Jurcik et al. |

FOREIGN PATENT DOCUMENTS

| | | |
|---|---|---|
| JP | 63-500030 A | 1/1988 |
| JP | 5-177126 A | 7/1993 |
| JP | 6-500621 A | 1/1994 |
| JP | 8-17749 A | 1/1996 |
| JP | 8-175897 A | 7/1996 |
| JP | 9-143740 A | 6/1997 |
| JP | 9-186107 A | 7/1997 |
| JP | 9-298171 A | 11/1997 |
| JP | 10-88349 A | 4/1998 |
| JP | 2002328055 A | 11/2002 |
| JP | 2009094424 A | 4/2009 |
| JP | 2011513950 A | 4/2011 |
| WO | 8607615 A1 | 12/1986 |
| WO | 9205406 A1 | 4/1992 |
| WO | 9520127 A1 | 7/1995 |
| WO | 02088692 A2 | 11/2002 |
| WO | 2009105376 A2 | 8/2009 |

* cited by examiner

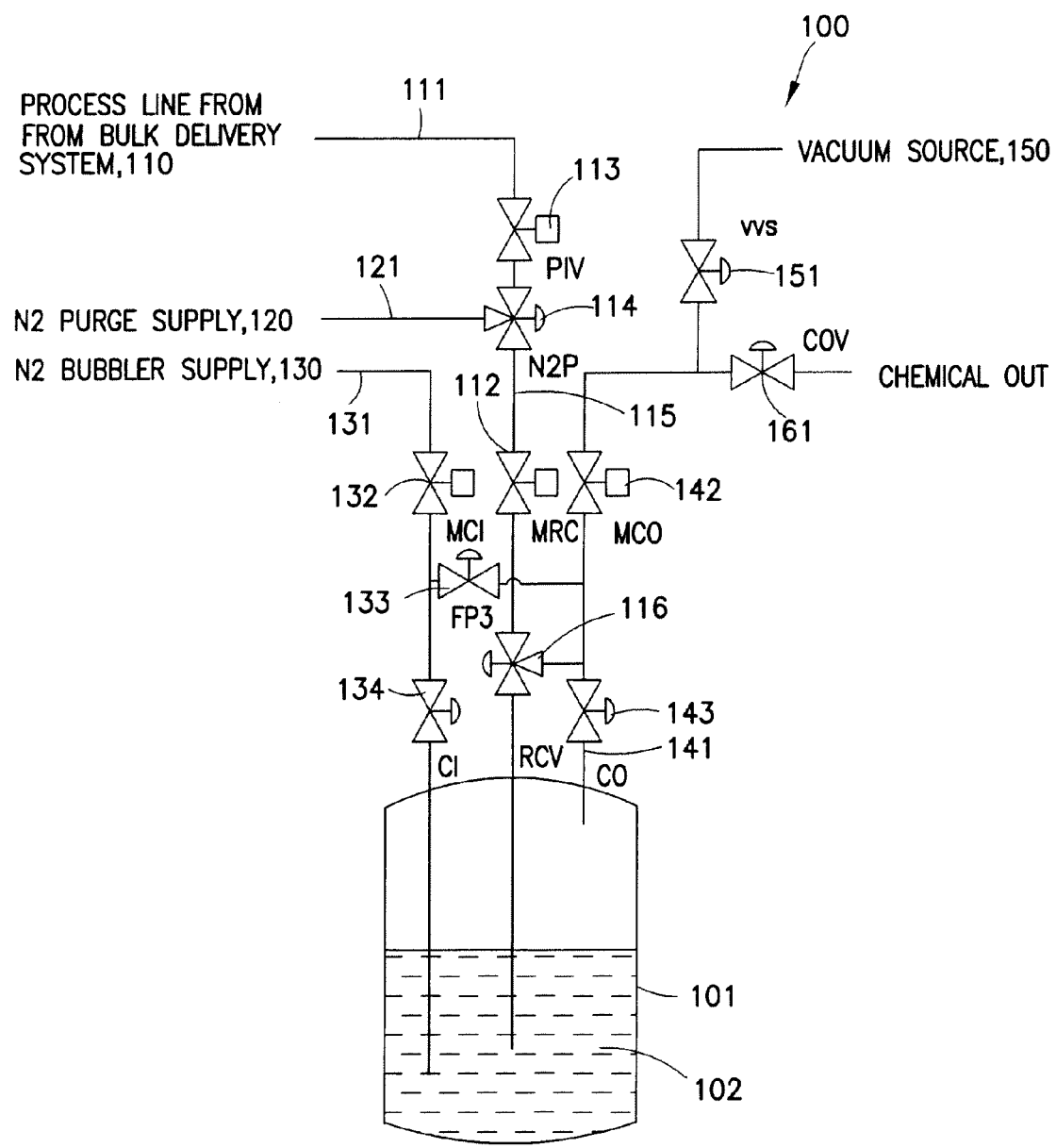

REFILLABLE AMPOULE WITH PURGE CAPABILITY

CROSS-REFERENCE TO RELATED APPLICATIONS

This application is a U.S. national phase under the provisions of 35 U.S.C. §371 of International Patent Application No. PCT/US12/39386 filed May 24, 2012, which in turn claims the benefit of priority of U.S. Provisional Patent Application No. 61/491,178 filed May 28, 2011. The disclosures of such international patent application and U.S. provisional priority patent application are hereby incorporated herein by reference in their respective entireties, for all purposes.

FIELD

The present disclosure relates to a fluid delivery system incorporating a refillable ampoule with purge capability, a method of purging a fluid delivery system, and a manifold adapted for purging a fluid delivery system. In various aspects, the present disclosure relates to isolating any of a process line and/or ampoule in a fluid delivery system during a purge, a method of purging a fluid delivery system in isolation of a process line and/or ampoule, and a manifold adapted for purging a fluid delivery system in isolation of a process line and/or ampoule. While the focus herein is primarily on fluid delivery systems and methods for semiconductor applications, the systems and methods disclosed herein are adaptable in a broad array of fields.

DESCRIPTION OF THE RELATED ART

In the use of fluid delivery systems, particularly in fields desiring a continuous supply of high purity fluids, e.g., liquids or vapor-phase material, refillable ampoules are often utilized to maintain an uninterrupted flow of the fluid to a location of use (e.g., a semiconductor manufacturing tool). When the fluid in a refillable ampoule needs to be refilled e.g., as sensed by a fluid inventory monitoring device or assembly, a bulk delivery system can be connected to the refillable ampoule through a process line to refill the ampoule. Many such ampoules are capable of being refilled while dispensing fluids to a location of use.

A number of fluids utilized in semiconductor applications are highly volatile. Great care must be exercised in the use of such highly volatile fluids, particularly during removal of refillable ampoules. Refillable ampoules must be periodically removed, cleaned, and/or replaced to minimize the accumulation of contaminants in the ampoules. Removal of an ampoule from a semiconductor fluid delivery system and manifold is a tedious process that currently requires an extended period of purging fluid from the system. For example, emptying the ampoule and draining the process line back to the fluid delivery system can take a number of days using conventional purge methods. The resulting down-time for the semiconductor manufacturing tool results in substantial losses in revenue.

In consequence, the art continues to seek improvements in systems, manifolds, and methods for limiting the down-time associated with removal and/or cleaning of a refillable ampoule and purging of process lines.

SUMMARY

The present disclosure relates to a system, method, and manifold adapted to isolate a process line and/or ampoule during a purge.

In one aspect, the disclosure relates to a fluid delivery system adapted to isolate any of an ampoule and process line during purge, the system comprising an inlet control valve arranged to connect a source of pressurized gas to a refillable ampoule, an outlet control valve arranged to connect the refillable ampoule to a location of use, a process control valve arranged to connect a process line to the refillable ampoule, a process isolation valve, and a purge supply valve, e.g., a three-way purge supply valve, arranged between the process isolation valve and the process control valve.

In another aspect, the disclosure relates to a method of purging a fluid delivery system, the method comprising closing a process isolation valve, wherein the process isolation valve connects a process line to a refillable ampoule, supplying a purge gas through a purge supply valve, e.g., a three-way purge supply valve, coupled to the process line between the process isolation valve and the refillable ampoule, and cycling open and close at least once a process control valve coupled to the process line between the purge supply valve, e.g., three-way purge supply valve, and the refillable ampoule.

In a further aspect, the disclosure relates to a manifold adapted to refill an ampoule and purge a fluid delivery system, the manifold comprising an inlet control valve connected to a source of pressurized gas, a purge supply valve, e.g., a three-way purge supply valve, connected to a source of purge supply gas, a process isolation valve connected to the purge supply valve, e.g., three-way purge supply valve, a process control valve, e.g., a three-way process control valve, connected to the purge supply valve, e.g., three-way purge supply valve, a vacuum source valve connected to a vacuum source, and an outlet control valve connected to the process control valve, e.g., three-way process control valve, the vacuum source valve, and a bypass valve, wherein the bypass valve is connected to the inlet control valve.

Other aspects, features and embodiments of the disclosure will be more fully apparent from the ensuing description and appended claims.

BRIEF DESCRIPTION OF THE DRAWINGS

FIG. 1 is a schematic representation of a fluid delivery system and manifold according to one embodiment of the present disclosure.

DETAILED DESCRIPTION

The present disclosure relates to fluid delivery systems, methods, and to manifolds for isolating process lines and/or ampoules during a purge of such systems.

In one embodiment, a fluid delivery system is adapted to isolate any of an ampoule and process line during purge, wherein the system includes an inlet control valve arranged to connect a source of pressurized gas to a refillable ampoule, an outlet control valve arranged to connect the refillable ampoule to a location of use, a process control valve, e.g., a three-way process control valve, arranged to connect a process line to the refillable ampoule, a process isolation valve, and a purge supply valve, e.g., a three-way purge supply valve, arranged between the process isolation valve and the process control valve.

The fluid delivery system of the present disclosure enables rapid purge of the system by isolating the refillable ampoule and/or the process line that connects to a bulk delivery system.

Unless otherwise defined, terms used herein should be construed to have the same meaning as commonly understood by one of ordinary skill in the art to which this disclosure relates. It will be further understood that terms used herein should be interpreted as having meanings that are consistent with the context of this specification and the relevant art.

Unless the absence of one or more elements is specifically recited, the terms "comprising," "including," and "having" as used herein should be interpreted as open-ended terms that do not preclude the presence of one or more elements.

The phrase "fluid delivery system" as used herein refers to any system adapted to deliver fluid to a location of use from an ampoule. In various embodiments, the ampoule comprises a refillable ampoule. In one embodiment, a fluid delivery system includes a manifold coupled to a refillable ampoule for refilling the ampoule and supplying fluid from the ampoule to a location of use.

The phrase "bulk delivery system" as used herein refers to any system adapted to deliver fluid to a fluid delivery system and/or refillable ampoule. In one embodiment, a bulk delivery system is connected to the fluid delivery system and/or refillable ampoule through a process line and is arranged for refilling the refillable ampoule. Bulk delivery systems of such general type are commercially available from ATMI, Inc., Danbury, Conn. USA under the trademark Unichem®, including bulk delivery systems of the Unichem® 3000 Series and the Unichem® 3250 bulk delivery system.

The term "vacuum" as used herein in reference to a "vacuum source" means a low pressure that is effective for providing a pressure differential. Such low pressure may be subatmospheric pressure, atmospheric pressure, or low superatmospheric pressure. The vacuum source itself may comprise a pump, compressor, blower, ejector, eductor, venturi, or other device or apparatus that is effective to provide the requisite vacuum in the fluid delivery system.

As previously discussed, the time needed to purge an entire fluid delivery system from a process line back to the fluid delivery system can be on the order of days in current semiconductor manufacturing installations. Additional time may be required to fully empty the refillable ampoule prior to removal. The present system allows for purge prior to removal of the ampoule without purging the process line, emptying the ampoule or affecting other systems that are connected to the bulk delivery system, thereby significantly reducing the down-time of the semiconductor manufacturing tool. Since periodic removal, maintenance, or cleaning of an ampoule is necessary in high purity fluid delivery systems, the present system, method, and manifold improve the efficiency of such ampoule handling.

In one embodiment, a process line connects the bulk delivery system to the liquid delivery system and includes a process isolation valve for closing the line connection between the bulk delivery system and the liquid delivery system. The process isolation valve allows for the bulk delivery system and the process line from the process isolation valve to the bulk delivery system to be isolated during a purge of the system.

In various embodiments, a purge supply valve, e.g., a three-way purge supply valve, is arranged between the process isolation valve and the refillable ampoule for supplying a purge gas from a purge gas supply source to the process line between the process isolation valve and the ampoule.

The term "three-way valve" as used herein (and including any type of three-way valve, e.g., three-way purge supply valve and three-way process control valve) means a valve adapted for connecting three separate fluid lines, or connecting one fluid line to a second fluid line at a point on the second fluid line other than at an end-point of the second fluid line. It will be recognized that specific arrangements of valves can be utilized in place of three-way valves, including combinations of two-way valves, four-way valves with one valve port capped off, etc.

Any of the valves employed in the fluid delivery system of the disclosure can independently be of manual or automatic character. When any such valve is automatic, it may be provided with suitable valve actuator/controller componentry operatively linked with a central processor unit or operational monitoring and control assembly, whereby the respective valves can be actuated for opening/closing as required, in accordance with a predetermined cycle of operations.

In a further embodiment, a process control valve, e.g., a three-way process control valve, is arranged between the purge supply valve, e.g., three-way purge supply valve, and the ampoule for isolating the ampoule during purge of the fluid delivery system. The process control valve may comprise a three-way process control valve arranged between a three-way purge supply valve and the ampoule for bypassing the ampoule during purge of the fluid delivery system. The process control valve, e.g., three-way process control valve, may be connected to an outlet control valve and/or a fluid outlet line. In various embodiments, the fluid outlet line connects the ampoule to the location of use, and may be coupled to a vacuum source valve and vacuum source. In various embodiments, the fluid outlet line is connected to a point of disposal (e.g., exhaust or canister). The process control valve may comprise a plurality of process control valves, any of which may comprise three-way valves, manual valves, automatic valves, two-way valves, four-way valves with a port capped off, or the like.

The fluid delivery system disclosed herein may comprise an inlet control valve connecting a source of pressurized gas to the ampoule through a pressurized gas supply line. The inlet control valve may comprise a plurality of inlet control valves, any of which may comprise a manual valve.

The fluid delivery system disclosed herein may comprise a bypass valve connecting the pressurized gas supply line to the fluid outlet line, thereby bypassing the ampoule and process line.

The fluid delivery system disclosed herein may comprise an outlet control valve connected to any of a process control valve (e.g., a three-way process control valve), a chemical outlet valve, a vacuum source valve, a bypass valve, a refillable ampoule, and a location of use. In various embodiments, an outlet control valve and/or chemical outlet valve controls delivery of fluid from the ampoule to a location of use. The outlet control valve may comprise a plurality of outlet control valves, any of which may comprise a manual valve.

The fluid delivery system disclosed herein provides a purge of the pressurized gas supply line, process line between the process isolation valve and ampoule, and fluid outlet line (collectively, "lines"). The fluid delivery system may optionally be utilized to empty the ampoule, or instead purge only the lines without having to empty the ampoule. Purging of the lines in isolation of the process line to the bulk delivery system involves closing the process isolation valve during the purge. Purging of the lines in isolation of the ampoule and process line involves closing the process isolation valve and closing one path of the process control valve, e.g., three-way process control valve, connected to the ampoule to bypass the ampoule and purge the system through to the fluid outlet lines.

The location of use in the deployment of the above-described system can be any suitable location wherein the supplied fluid is utilized, e.g., to perform a process, treatment, or other utilization function. In one embodiment, the location of use comprises a semiconductor manufacturing location, which may for example comprise a semiconductor manufacturing tool in which the supplied fluid is utilized, such as for deposition, ion implantation, etching, or other fluid-using operation or process.

In one implementation, a method of purging a fluid delivery system is disclosed comprising closing a process isolation valve, wherein the process isolation valve connects a process line to a refillable ampoule, supplying a purge gas through a purge supply valve, e.g., a three-way purge supply valve, coupled to the process line between the process isolation valve and the refillable ampoule, and cycling open and close at least once a process control valve coupled to the process line between the purge supply valve, e.g., three-way purge supply valve, and the refillable ampoule.

Such method may further comprise initiating a vacuum source coupled to a fluid outlet line, wherein the fluid outlet line is connected to the refillable ampoule. Such method may further comprise flowing a purge gas through any of the purge supply valve (e.g., three-way purge supply valve), an inlet control valve, an outlet control valve, and a bypass valve. Such method may further comprise closing all valves. Such method may further comprise maintaining a supply of gas for removal of the refillable ampoule. Such method may further comprise isolating the refillable ampoule.

In various embodiments of the disclosed method, the inlet control valve is coupled to a pressurized gas supply line, the outlet control valve is coupled to a fluid outlet line, and the bypass valve is coupled to both the pressurized gas line and the fluid outlet line. In still further various embodiments, the process control valve comprises a three-way process control valve.

The method may be implemented with the location of use of the supplied gas being a semiconductor manufacturing location, e.g., a semiconductor manufacturing tool, such as for example a vapor deposition apparatus, an ion implanter, an etching apparatus, a photolithography unit, a wafer cleaning apparatus, etc.

In one embodiment, the method is initiated with a closing of all valves, followed by a purging of the process line from the ampoule to a location of use or a point of disposal, and back to the ampoule. The purging may be followed by initiating a vacuum source coupled to a fluid outlet line. The initiating step may be followed by closing the process isolation valve. The step of closing may be followed by cycling open and close at least once a process control valve coupled to the process line between the purge supply valve, e.g., three-way purge supply valve, and the refillable ampoule. In various embodiments, the process control valve comprises a three-way process control valve. In various embodiments, the cycling open and close action occurs a plurality of times.

The cycling may be followed by an opening of the purge supply valve, e.g., three-way purge supply valve, to initiate a supply of purge gas. In various embodiments, the purge gas may be any inert gas such as for example nitrogen, argon, helium, xenon, etc. The opening of the purge supply valve, e.g., three-way purge supply valve, may be followed by additional cycling open and close of the process control valve. The additional cycling may be followed by any one or more of: (1) closing the process control valve, e.g., three-way process control valve, (2) purging of the process line (through the inlet control valve and/or outlet control valve) from the ampoule to a location of use or a point of disposal, (3) closing all valves, (4) maintaining a supply of gas for removal of the refillable ampoule, and (5) removal of the ampoule.

A still further implementation can be constituted as a manifold adapted to refill an ampoule and purge a fluid delivery system, the manifold comprising: (a) an inlet control valve connected to a source of pressurized gas; (b) a purge supply valve, e.g., three-way purge supply valve, connected to a source of purge supply gas; (c) a process isolation valve connected to the purge supply valve, e.g., three-way purge supply valve; (d) a process control valve, e.g., three-way process control valve, connected to the three-way purge valve; (e) a vacuum source valve connected to a vacuum source; and (f) an outlet control valve connected to the process control valve (e.g., three-way process control valve), the vacuum source valve, and a bypass valve, wherein the bypass valve is connected to a the inlet control valve.

Such manifold as disclosed may further comprise any of: (a) a second inlet control valve connected to the (first) inlet control valve; (b) a second outlet control valve connected to the (first) outlet control valve; (c) a chemical outlet valve connected to the outlet control valve; and (d) a two-way process control valve connected to a three-way process control valve. In various embodiments, a three-way purge supply valve, process isolation valve, and a three-way process control valve are arranged for isolating any of a process line and an ampoule during purge.

The advantages and features of the disclosure are further illustrated with reference to the following example, which is not in any way to be construed as limiting the scope of the disclosure but rather as being illustrative of one embodiment of the disclosure, in a specific application thereof.

A system 100 of the type shown schematically in FIG. 1 may be employed in accordance with various embodiments of the present disclosure, incorporating a refillable ampoule 101 for delivering fluid 102 through a fluid outlet line 141 and outlet control valve 143 to a location of use (not shown); a source of pressurized gas 130 connected to the refillable ampoule 101 and utilized to drive fluid 102 from the refillable ampoule 101; a process line 111 and 115 for refilling the refillable ampoule 101; a process isolation valve 113 for isolating the process line 111 between a bulk delivery system 110 and the process isolation valve 113; a source of purge supply gas 120 connected by a three-way purge supply valve 114 to the process line 115 between the process isolation valve 113 and the refillable ampoule 101; and a three-way process control valve 116 connecting the process line 115 to the fluid outlet line 141 for bypassing the ampoule 101 during purge.

The system 100 disclosed in FIG. 1 may also incorporate an inlet control valve 134 and manual control valve 132 along the pressurized gas supply line 131 connecting the source of pressurized gas 130 to the refillable ampoule 101. The pressurized gas supply line 131 may also include a bypass valve 133 for bypassing the refillable ampoule 101. In various embodiments, the process line may include a manual process control valve 112 in addition to the three-way process control valve 116. In various embodiments, the fluid outlet line 141 includes a manual outlet control valve 142 and/or a chemical outlet valve 161. The disclosed system 100 may also include a vacuum source 150 connected by a vacuum source valve 151 to the fluid outlet line 141.

The system 100 generally disclosed in FIG. 1 incorporates a manifold that includes (a) an inlet control valve 134 and/or 132 connected to a source of pressurized gas; (b) a three-way purge supply valve 114 connected to a source of purge supply gas 120; (c) a process isolation valve 113 connected to the three-way purge valve 114; (d) a three-way process control valve 116 connected to the three-way purge valve 114; (e) a vacuum source valve 151 connected to a vacuum source 150; and (f) an outlet control valve 143 and/or 142 connected to the three-way process control valve 116, the vacuum source valve 151, and a bypass valve 133, wherein the bypass valve is connected to the inlet control valve 134 and/or 132.

The system of the general type disclosed in FIG. 1 will allow for a rapid (e.g., 2-3 hours) local (e.g., within the manifold disclosed herein) purge of the fluid delivery system 100 in isolation of a process line 111 between bulk delivery system 110 and process isolation valve 113 as a result of closing process isolation valve 113, and/or in isolation of refillable ampoule 101 with the termination of the connection between process line 115 and ampoule 101 by closing the portion of the three-way process control valve 116 connected to the ampoule 101 and redirecting the purge from the process line 115 to the fluid outlet line 141.

It is to be appreciated that any of the elements and features described herein may be combined with any one or more other elements and features, within the broad scope of the disclosure.

While the disclosure has been has been described herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A fluid delivery system adapted to isolate an ampoule and/or process line during purge, the system comprising:
    an inlet control valve arranged to connect a source of pressurized gas to a refillable ampoule;
    an outlet control valve arranged to connect the refillable ampoule to a location of use;
    a process control valve arranged to connect a process line from a bulk delivery system to the refillable ampoule for refilling thereof;
    a process isolation valve coupled to the process line; and
    a purge supply valve coupled to the process line between the process isolation valve and the process control valve, with the purge supply valve, process isolation valve, and process control valve being in line with one another in the process line.

2. The system of claim 1, further comprising a bypass valve arranged to connect the inlet control valve and the outlet control valve.

3. The system of claim 1, wherein the inlet control valve comprises a plurality of inlet control valves.

4. The system of claim 1, wherein the process control valve comprises a plurality of process control valves.

5. The system of claim 4, wherein at least one of the plurality of process control valves is a three-way process control valve.

6. The system of claim 1, wherein the outlet control valve comprises a plurality of outlet control valves.

7. The system of claim 1, further comprising a vacuum source valve arranged to connect a vacuum source to the refillable ampoule.

8. The system of claim 1, further comprising a chemical outlet valve arranged to connect the outlet control valve to the location of use.

9. The system of claim 1, wherein the location of use comprises a semiconductor manufacturing location.

10. The system of claim 1, wherein the outlet control valve is coupled to an outlet line for delivering fluid from the refillable ampoule to the location of use, and wherein the process control valve comprises a three-way process control valve connecting the process line to the fluid outlet line for bypassing the refillable ampoule during purge.

11. The system of claim 1, wherein the purge supply valve comprises a three-way purge supply valve.

* * * * *